US009722595B2

(12) United States Patent
Tao et al.

(10) Patent No.: US 9,722,595 B2
(45) Date of Patent: Aug. 1, 2017

(54) ULTRA HIGH PERFORMANCE SILICON CARBIDE GATE DRIVERS

(71) Applicant: General Electric Company, Schenectady, NY (US)

(72) Inventors: Fengfeng Tao, Niskayuna, NY (US); Michael Joseph Schutten, Niskayuna, NY (US); Jeffrey Joseph Nasadoski, Gloversville, NY (US); Maja Harfman-Todorovic, Niskayuna, NY (US); John Stanley Glaser, Schenectady, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 14/983,251

(22) Filed: Dec. 29, 2015

(65) Prior Publication Data

US 2017/0187369 A1 Jun. 29, 2017

(51) Int. Cl.
*H03K 17/687* (2006.01)
*H03K 17/16* (2006.01)
*H05K 3/36* (2006.01)
*H03K 17/691* (2006.01)

(52) U.S. Cl.
CPC ......... *H03K 17/162* (2013.01); *H03K 17/691* (2013.01); *H05K 3/36* (2013.01)

(58) Field of Classification Search
USPC ....... 327/109, 403–404; 377/70, 74; 345/84, 345/87, 100
See application file for complete search history.

(56) References Cited

U.S. PATENT DOCUMENTS

| 6,611,248 B2 * | 8/2003 | Kanbara | G09G 3/3677 323/313 |
| 7,928,774 B2 | 4/2011 | Zannoth et al. | |
| 7,965,522 B1 | 6/2011 | Hornberger et al. | |
| 7,969,226 B2 | 6/2011 | Kelley | |
| 8,847,631 B2 | 9/2014 | Tao et al. | |
| 2010/0321363 A1 * | 12/2010 | Morita | G09G 3/2965 345/211 |

(Continued)

FOREIGN PATENT DOCUMENTS

EP 2942866 A1 11/2015

OTHER PUBLICATIONS

Mohammad A. Huque et al. "A 200°C. Universal Gate Driver Integrated Circuit for Extreme Environment Application" IEEE Transactions on Power Electronics, vol. 27, No. 9, Sep. 2012.

(Continued)

Primary Examiner — An Luu
(74) Attorney, Agent, or Firm — John P. Darling (57) ABSTRACT

A system includes a SiC semiconductor power device; a power supply board that is configured to provide power to a first gate driver board via a connector; the first gate driver board that is coupled and configured to provide current to the SiC semiconductor power device, wherein the first gate driver board is coupled to the power supply board via the connector, and wherein the first gate driver board is separated from the power supply board; and an interconnect board that is coupled to the first gate driver board, wherein the interconnect board is configured to couple the first gate driver board a second gate driver board.

22 Claims, 8 Drawing Sheets (56) References Cited

U.S. PATENT DOCUMENTS

| | | |
|---|---|---|
| 2011/0084674 A1 | 4/2011 | Cadoux |
| 2013/0063184 A1 | 3/2013 | Liang et al. |
| 2013/0187684 A1 | 7/2013 | Gangopadhya |
| 2013/0200929 A1 | 8/2013 | Sawada et al. |
| 2014/0043089 A1 | 2/2014 | Schiller et al. |
| 2014/0184186 A1 | 7/2014 | Glaser et al. |

OTHER PUBLICATIONS

Mohammad A. Huque et al. "Silicon-on-insulator-based high-voltage, high-temperature integrated circuit gate driver for silicon carbide-based power field effect transistors" Feb. 3, 2009.

Javier Valle-Mayorga et al. "High-Temperature Silicon-on-Insulator Gate Driver for SiC-FET Power Modules" Nov. 11, 2012.

Philip Anthony et al. "High-Speed Resonant Gate Driver With Controlled Peak Gate Voltage for Silicon Carbide MOSFETs" Feb. 2014.

Zheyu Zhang et al. "Active Gate Driver for Crosstalk Suppression of SiC Devices in a Phase-Leg Configuration" Apr. 2014.

Benjamin Wrzecionko et al. "Novel AC-Coupled Gate Driver for Ultrafast Switching of Normally Off SiC JFETs" Jul. 2012.

Kaichien Tsai "EMI Modeling and Characterization for Ultra-Fast Switching Power Circuit Based on SiC and GaN Devices" 2013.

Developers of 3C-SiC/Si "Advantages of Silicon Carbide in Power Electronics" 2014 (last accessed Dec. 29, 2015) http://www.anvil-semi.co.uk/advantages-of-silicon-carbide-in-power-electronics/.

International Search Report and Written Opinion issued in connection with corresponding PCT Application No. PCT/US2016/067555 on Mar. 17, 2017.

* cited by examiner

ULTRA HIGH PERFORMANCE SILICON CARBIDE GATE DRIVERS

BACKGROUND

The subject matter disclosed herein relates to silicon carbide (SiC) semiconductor power devices and more specifically to reducing electromagnetic interference (EMI) noise in gate drivers of the SiC semiconductor power devices.

The SiC semiconductor power devices may be used in semiconductor applications due to their superior performance. In particular, the SiC semiconductor power devices sustain higher voltages, carry higher currents, operate at higher temperatures and higher thermal conductivity, switch faster, and exhibit higher energy band gap (when compared to silicon semiconductor devices). These benefits enable the SiC semiconductor power devices to have smaller circuit footprints and higher efficiency. However, the compact design of the circuit containing the SiC semiconductor power device is more susceptible to electromagnetic interference (EMI) noise.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

A first embodiment includes a system that includes one or more silicon carbide semiconductor power devices. The system also includes a power supply circuit board that is configured to provide power to a first gate driver circuit board via a connector, wherein the power supply circuit board includes an isolation transformer. The system further includes the first gate driver circuit board that is coupled to the one or more silicon carbide semiconductor power devices and configured to provide current to drive one or more gates of the one or more silicon carbide semiconductor power devices, wherein one or more signal paths of the first gate driver circuit board are coupled to one or more signal paths of the power supply circuit board via the connector, and wherein the first gate driver circuit board is separated from the power supply circuit board. The system also includes an interconnect circuit board that is coupled to the first gate driver circuit board, wherein the interconnect circuit board is configured to couple the one or more signal paths of the first gate driver circuit board to one or more signal paths of a second gate driver circuit board.

A second embodiment includes a system that includes one or more silicon carbide metal-oxide-semiconductor field-effect transistors. The system also includes a power supply circuit board that is configured to provide power to a first gate driver circuit board, wherein the power supply circuit board includes a tracing layer disposed on a copper layer. The system further includes the first gate driver circuit board that is coupled to the one or more silicon carbide metal-oxide-semiconductor field-effect transistors, wherein the first gate driver circuit board is configured to provide current to drive one or more gates of the one or more silicon carbide metal-oxide-semiconductor field-effect transistors, wherein one or more signal paths of the first gate driver circuit board are coupled to one or more signal paths of the power supply circuit board, wherein the first gate driver circuit board is separated from the power supply circuit board, and wherein the first gate driver circuit board includes a tracing layer disposed on a copper layer. The system also includes an interconnect circuit board that is coupled to the first gate driver circuit board, wherein the interconnect circuit board is configured to couple the one or more signal paths of the first gate driver circuit board to one or more signal paths of a second gate driver circuit board, wherein the interconnect circuit board includes a tracing layer disposed on a copper layer, and wherein the second gate driver circuit board includes a tracing layer disposed on a copper layer.

A third embodiment includes a method that includes coupling a first gate driver circuit board and a second gate driver circuit board to an interconnect circuit board, wherein the first gate driver circuit board and the second gate driver circuit board are configured to provide current to drive one or more gates of one or more silicon carbide semiconductor power devices and wherein the interconnect circuit board is configured to couple one or more signal paths of the first gate driver circuit board to one or more signal paths of a second gate driver circuit board. The method also includes coupling a first power supply circuit board to the first gate driver circuit board via a first set of connectors, wherein each connector of the first set of connectors includes a first portion disposed on the first power supply circuit board and a second portion disposed on the first gate driver circuit board. The method further includes providing power to the first gate driver circuit board from one or more power supplies of the first power supply circuit board via the first set of connectors. The method also includes providing power to the second gate driver circuit board from the one or more power supplies of the first power supply circuit board via the first set of connectors and the interconnect circuit board. The method further includes uncoupling the first power supply circuit board from the first gate driver circuit board. The method also includes coupling a second power supply circuit board to the first gate driver circuit board via a second set of connectors, wherein each connector of the second set of connectors includes a third portion disposed on the second power supply circuit board and the second portion disposed on the first gate driver circuit board. The method further includes providing power to the first gate driver circuit board from one or more power supplies of the second power supply circuit board via the second set of connectors. The method also includes providing power to the second gate driver circuit board from the one or more power supplies of the second power supply circuit board via the second set of connectors and the interconnect circuit board.

A fourth embodiment includes a system that includes a first set of silicon carbide semiconductor power devices. The system also includes a second set of silicon carbide semiconductor power devices. The system further includes a first power supply circuit board, configured to provide power to a first gate driver circuit board. The system also includes a second power supply circuit board, configured to provide power to a second gate driver circuit board. The system further includes the first gate driver circuit board, coupled to the first set of silicon carbide semiconductor power devices and configured to provide current to drive one or more gates of the first set of silicon carbide semiconductor power devices, wherein one or more signal paths of the first gate driver circuit board are coupled to one or more signal paths of the first power supply circuit board, and wherein the first gate driver circuit board is separated from the first power supply circuit board. The system also includes the second gate driver circuit board, coupled to the second set of silicon carbide semiconductor power devices and configured to provide current to drive one or more gates of the second set of silicon carbide semiconductor power devices, wherein one or more signal paths of the second gate driver circuit board are coupled to one or more signal paths of the second power supply circuit board, and wherein the second gate driver circuit board is separated from the second power supply circuit board. The system also includes a controller, including one or more processors, wherein the controller is coupled to the first power supply circuit board and the second power supply circuit board, wherein the one or more processors are configured to control a total power provided by the first power supply circuit board and the second power supply circuit board.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time-consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

A silicon carbide (SiC) semiconductor power device may interface with logic units by using a gate driver circuit. The gate driver is a power amplifier that accepts a low-power input and generates a high-current output to drive a gate capacitance of the SiC semiconductor power device. Positioning the gate driver next to or near the SiC semiconductor power device minimizes system complexity and enables the gate driver to switch the SiC semiconductor power device at a high speed. However, fast switching of the SiC semiconductor power device by the gate driver may result in sharp transitions in voltage and current, in turn resulting in higher electromagnetic interference (EMI) noise. The close proximity of the gate driver and power supply components of the SiC semiconductor power device sharing space on one or more circuit boards compounds the EMI noise generated by the gate driver and impedes performance of the SiC semiconductor power device. It would be advantageous to reduce the EMI noise generated by the gate driver without slowing the switching time.

The present disclosure includes systems and methods for a modular layout of gate driver circuit boards, power supply circuit boards, and interconnect circuit boards, wherein the modular system is designed to provide separation between the gate driver circuit boards and the power supply boards to reduce EMI noise, and wherein each circuit board may be easily replaced due to the modular layout. The present disclosure also includes embodiments that include circuitry that reduces common mode noise and tracing layers of circuit boards that reduce EMI noise.

Figure 1:
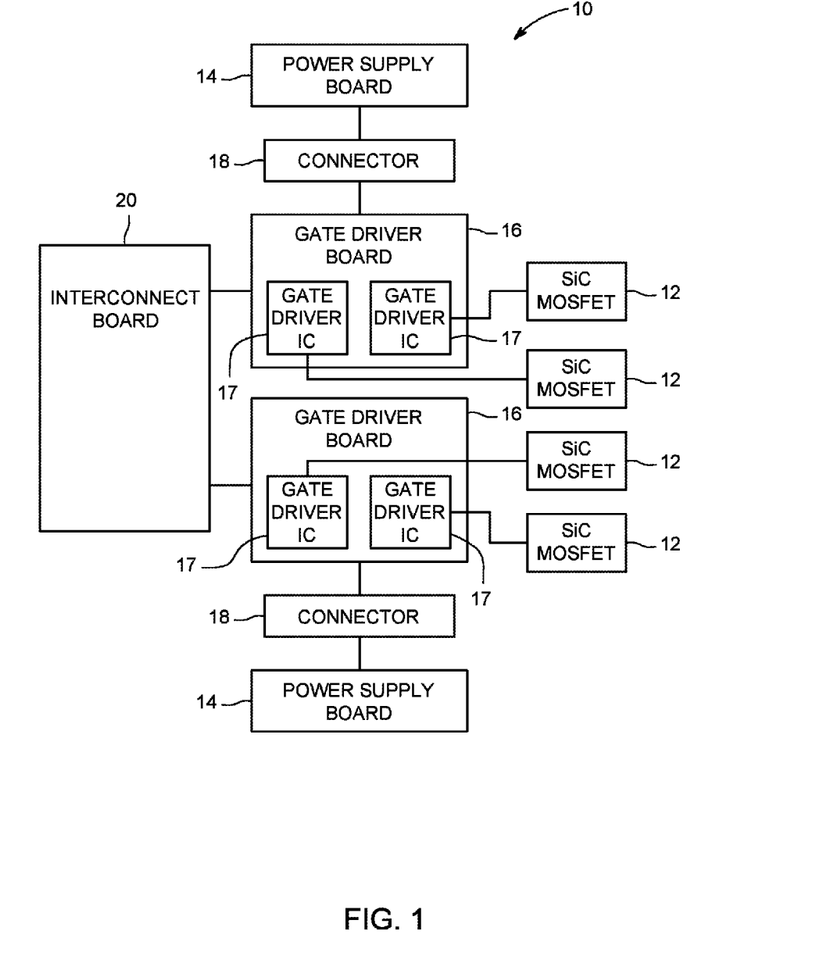
FIG. 1 is a block diagram of a modular system for use with a silicon carbide semiconductor power device, in accordance with an embodiment of the present disclosure.

Turning now to FIG. 1, a block diagram of a modular system 10 for use with a SiC semiconductor power device, in accordance with an embodiment of the present disclosure is illustrated. The SiC semiconductor power device may be a SiC metal-oxide-semiconductor field-effect transistor (MOSFET) as illustrated by 12, an insulated-gate bipolar transistor (IGBT), or any other SiC semiconductor power device. The SiC MOSFET 12 may be designed to handle significant power levels and switch at very high speed. When compared to a silicon semiconductor power device, the SiC MOSFET is capable of sustaining higher voltages, carrying higher currents, operating at higher temperatures, exhibiting higher thermal conductivity, faster switching, and exhibiting a higher energy band gap.

The modular system 10 also includes one or more power supply boards 14 that may provide power to one or more gate driver boards 16. In particular, the power supply boards 14 may generate, convert, or transfer power from one or more power supplies of the power supply board 14 to the gate driver boards 16. In some embodiments, the power supply boards 14 may isolate the gate driver boards 16 and/or the SiC MOSFET 12 from another power source. The power supply board 14 may also include one or more isolation transformers to provide galvanic isolation and protect the gate driver boards 16 and/or the SiC MOSFET 12. The isolation transformer may further suppress EMI noise generated from the power source. In some embodiments, the power supply board 14 may also be coupled to the SiC MOSFET 12.

The modular system 10 also includes the one or more gate driver boards 16 that may accept a low-power input and generate a high-current drive input. The gate driver board 16 may include one or more gate driver integrated circuits or chips 17 that amplify the input power for a gate of the SiC MOSFET 12. In particular, each gate driver integrated circuit 17 of the gate driver board 16 may be coupled to one or more SiC MOSFETs 12.

The gate driver board 16 may couple to the power supply board 14 via one or more connectors 18. The connector 18 may provide one or more signal paths of the gate driver board 16 to one or more signal paths of the power supply board 14. For example, the one or more signal paths may deliver signals that may include a fault signal, a command signal, a positive supply voltage signal, a negative supply voltage signal, a ground signal, etc. The connector 18 may be configured to enable plugging and unplugging the power supply board 14 into and out of the gate driver board 16 for ease of replacement.

The modular system 10 includes an interconnect board 20 that may provide connections between a plurality of gate driver boards 16. In particular, the interconnect board 20 may provide connections between power supply boards 14 via the connectors 18 and the gate driver boards 16, such that the power supplied by the one or more powers supplies of multiple power supply boards 14 may be combined and used by the modular system 10. Additionally, the one or more powers supplies of each power supply board 14 may operate at certain switching frequencies. Combining the power supplied by the one or more power supplies of the multiple power supply boards 14 may enable a higher switching frequency than may be realized by the one or more power supplies of each power supply board 14 alone. The interconnect board 20 may enable plugging and unplugging the gate driver boards 16 into and out of the interconnect board 20 for ease of replacement.

Figure 2:
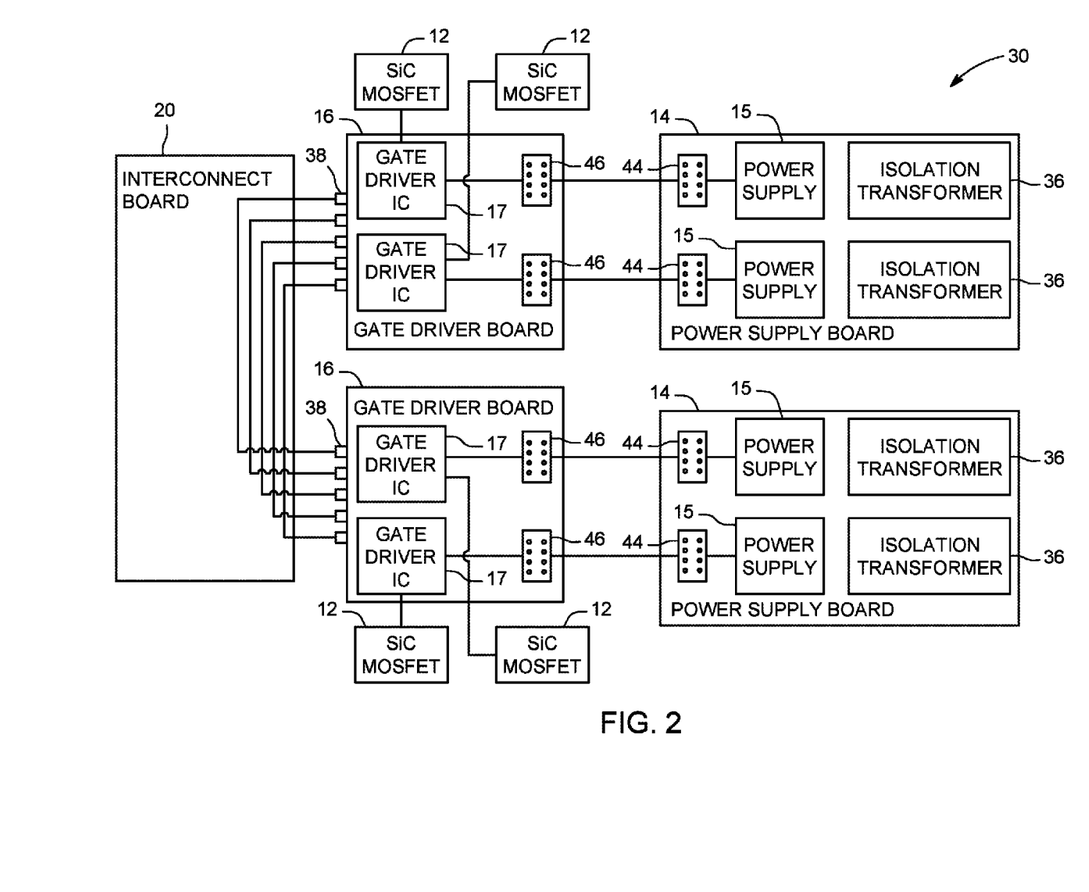
FIG. 2 is a schematic diagram of a modular system for use with a silicon carbide semiconductor power device, in accordance with an embodiment of the present disclosure.

With the foregoing in mind, FIG. 2 is a schematic diagram of a modular system 30 for use with a SiC semiconductor power device, in accordance with an embodiment of the present disclosure. In particular, the SiC semiconductor power device may be the SiC MOSFET 12.

The modular system 30 includes one or more power supply boards 14. The power supply board 14 may receive power from a power source. The power supply board 14 may include one or more isolation transformers 36 that may isolate the one or more gate driver integrated circuits 17 of the gate driver board 16 and/or the one or more SiC MOSFETs 12 from the one or more power supplies 15. For example, the isolation transformer 36 may provide galvanic isolation and protect the one or more gate driver integrated circuits 17 and/or the one or more SiC MOSFETs 12 from electric shock. The isolation transformer 36 may further suppress EMI noise generated from the one or more SiC MOSFETs 12 propagated to the one or more power supplies 15 or the rest of the system 30. In some embodiments, the power supply board 14 may provide input power from the one or more power supplies 15 to the SiC MOSFET 12.

The modular system 30 includes one or more gate driver boards 16. An input to the gate driver board 16 may receive a low-power signal. In particular, the low-power signal may be provided by the one or more power supplies 15 of the power supply board 14 coupled to the gate driver board 16 via one or more connectors 18. One or more gate driver integrated circuits 17 may amplify the low-power signal. The one or more gate driver integrated circuits 17 may output the amplified (e.g., high-current) signal to the one or more SiC MOSFETs 12 (e.g., a gate of the SiC MOSFET 12).

The gate driver board 16 may couple to the power supply board 14 via the one or more connectors 18. The connector 18 may couple one or more signal paths of the gate driver board 16 to one or more signal paths of the power supply board 14. The connector 18 may include a male-female connection, such that a male connection 44 of the connector 18 may be located on the power supply board 14 and a female connection 46 of the connector 18 may be located on the gate driver board 16, or vice versa. The male connection 44 and the female connection 46 of the connector 18 may be configured to enable plugging and unplugging the male connection 44 of the power supply board 14 into and from the female connection 46 of the gate driver board 16 for ease of replacement. The connector 18 may enable the power supply board 14 to provide input power to the gate driver board 16. In particular, the male connection 44 of the power supply board 14 may receive, as an input, an output of the isolation transformer 36. When connected to the female connection 46, the output of the isolation transformer 36 may be provided as an input to the gate driver integrated circuit 17 of the gate driver board 16. As depicted in FIG. 2, each power supply board 14 includes two power supplies 15 coupled to the male connection 44. Each male connection 44 may couple to a female connection 46 of the gate driver boards 16, which in turn is coupled to the gate driver integrated circuits 17 of the gate driver boards 16. In this manner, each power supply 15 may supply power to each gate driver integrated circuit 17 via each connector 18.

The modular system 30 includes the interconnect board 20 that may provide connections between a plurality of gate driver boards 16. In particular, the interconnect board 20 may couple the one or more signal paths of a first gate driver board 16 with the one or more signal paths of a second gate driver board 16. In particular, the interconnect board 20 may provide connections between power supply boards 14 via the connectors 18 and the gate driver boards 16, such that the power supplied by the one or more powers supplies of multiple power supply boards 14 may be combined and used by the modular system 10. Additionally, the one or more powers supplies of each power supply board 14 may operate at certain switching frequencies. Combining the power supplied by the one or more power supplies of the multiple power supply boards 14 may enable a higher switching frequency than may be realized by the one or more power supplies of each power supply board 14 alone. The interconnect board 20 may enable plugging and unplugging the gate driver boards 16 into and out of the interconnect board 20 for ease of replacement.

Figure 3:
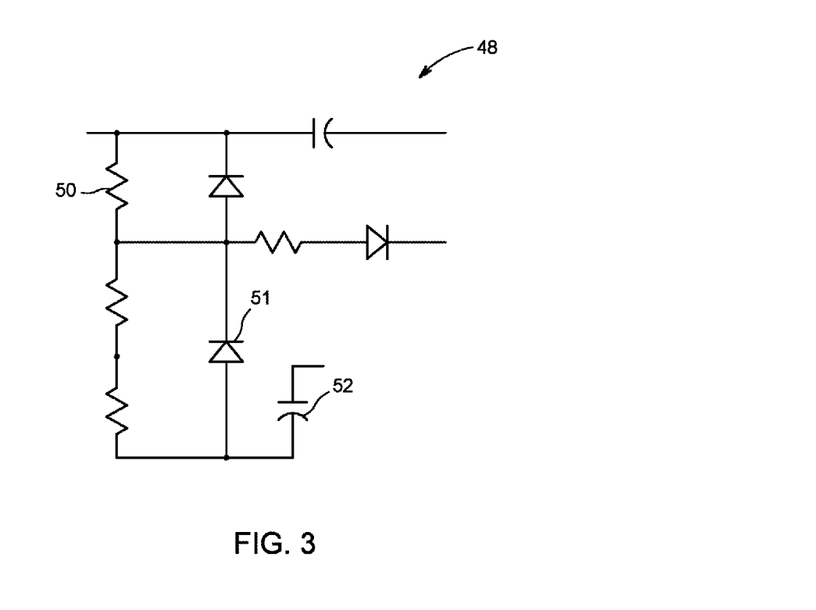
FIG. 3 is a schematic diagram of desaturation circuitry designed to bypass common mode noise, in accordance with an embodiment of the present disclosure.

In some embodiments, a circuit trace (e.g., path) of the power supply board 14, the gate driver board 16, and/or the interconnect board 20 may be susceptible to EMI noise, especially common mode noise. Common mode noise is noise that appears on two signal leads (i.e., signal and circuit return, or the terminals of a measuring circuit and ground). In particular, the gate driver board 16 may be sensitive to common mode noise as a result of switching the SiC semiconductor power device. For example, when the SiC MOSFET 12 is switched on, common mode noise may be generated. This common mode noise may affect the normal operation of the gate driver integrated circuit 17 of the gate driver board 17. FIG. 3 is a schematic diagram of desaturation circuitry 48 designed to bypass common mode noise, in accordance with an embodiment of the present disclosure. The desaturation circuitry 48 includes similar signal paths by utilizing similar circuit components. The similar signal paths may reduce common mode noise generated by switching the SiC MOSFET 12, for example, by directing a signal through the similar signal paths. In some embodiments, one or more resistors 50, diodes 51, and/or capacitors 52 may be used in the similar signal paths of the desaturation circuitry. In this manner, common mode noise generated by switching the SiC MOSFET 12 may be reduced and prevented from causing malfunction to the circuit trace that includes the desaturation circuitry 48.

In some embodiments, the layout of the modular system 30 may result in signal timing issues. In particular, the use of the power supply board 14, the gate driver board 16, and the interconnect board 20 may include using more logic and gates, causing a delay in propagating an input signal as it travels through the modular system 30. To address the delay, the modular system 30 may modify the input signal and/or other signals to match the propagation delay. In some embodiments, the interconnect board 20 may be designed to modify the input signal to match the propagation delay. In alternative embodiments, a supply voltage of the gate driver board 16 may be adjusted to match the propagation delay.

Figure 4:
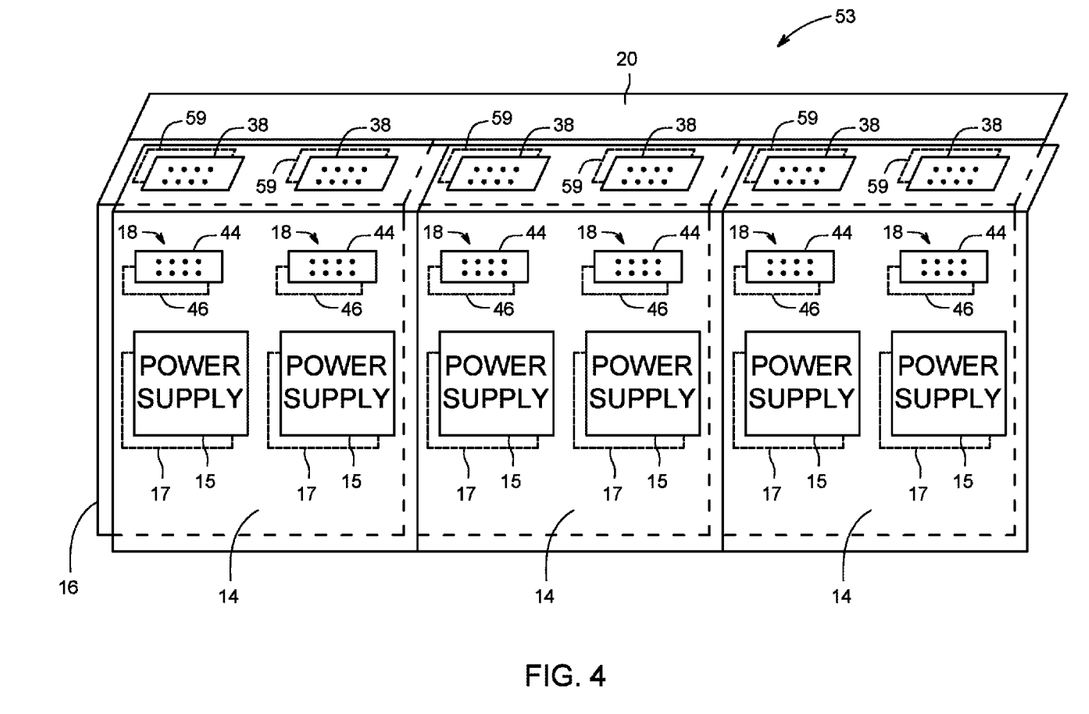
FIG. 4 is a schematic diagram of an arrangement of power supply boards, gate driver boards, and an interconnect board, in accordance with an embodiment of the present disclosure.

With the foregoing in mind, FIG. 4 is a schematic diagram of an arrangement 53 of the power supply boards 14, the gate driver boards 16, and the interconnect board 20, in accordance with an embodiment of the present disclosure. The interconnect board 20 may include one or more connection points 59 that may be configured to enable the one or more inputs 38 of the gate driver board 16 to be coupled for ease of replacement. In some embodiments, the connection point 59 of the interconnect board 20 is a female connection (e.g., a socket) while the input 38 of the gate driver board 16 is a male connection (e.g., a plug). As illustrated, the inputs 38 of the gate driver board 16 may be disposed on an edge of the gate driver board 16. Accordingly, the gate driver board 16 may be coupled to the interconnect board 20 in an approximately orthogonal (i.e., approximately 90°) orientation. The interconnect board 20 may provide connections between a plurality of the gate driver boards 16. In particular, the interconnect board 20 may couple the one or more signal paths of a first gate driver board 16 with the one or more signal paths of a second gate driver board 16. As depicted, the interconnect board 20 provides connections for three gate driver boards 16. In some embodiments, the interconnect board 20 provides connections for any number of gate driver boards (e.g., 2, 4, 5, 6, 7, 8, 9, or 10 gate driver boards).

A power supply board 14 may couple to the gate driver board 16 via the one or more connectors 18. The connector 18 may couple one or more signal paths of the gate driver board 16 to one or more signal paths of the power supply board 14. The connector 18 may include a male-female connection, such that a male connection 44 of the connector 18 may be located on the power supply board 14 and a female connection 46 of the connector 18 may be located on the gate driver board 16. The connector 18 may be configured to enable the one or more power supplies 15 of the power supply board 14 to provide input power to the one or more gate driver integrated circuits 17 of the gate driver board 16. Due to the design and location of the connector 18, when the power supply board 14 and the gate driver board 16 are coupled to one another via the connector 18, the power supply board 14 may be oriented approximately in parallel to the gate driver board 16. Enabling the power supply boards 14 and the gate driver boards 16 to "stack" in this manner may result in a compact and efficient configuration, while maintaining separation between the power supply boards 14 and the gate driver boards 16 in order to reduce EMI noise. As depicted, each of the three gate driver boards 16 connected to the interconnect board 20 is connected to a power supply board 14 by the connectors 18. As such, each gate driver integrated circuit 12 of the gate driver boards 16 may be powered by the one or more power supplies 15 of the power supply boards 14.

Figure 5:
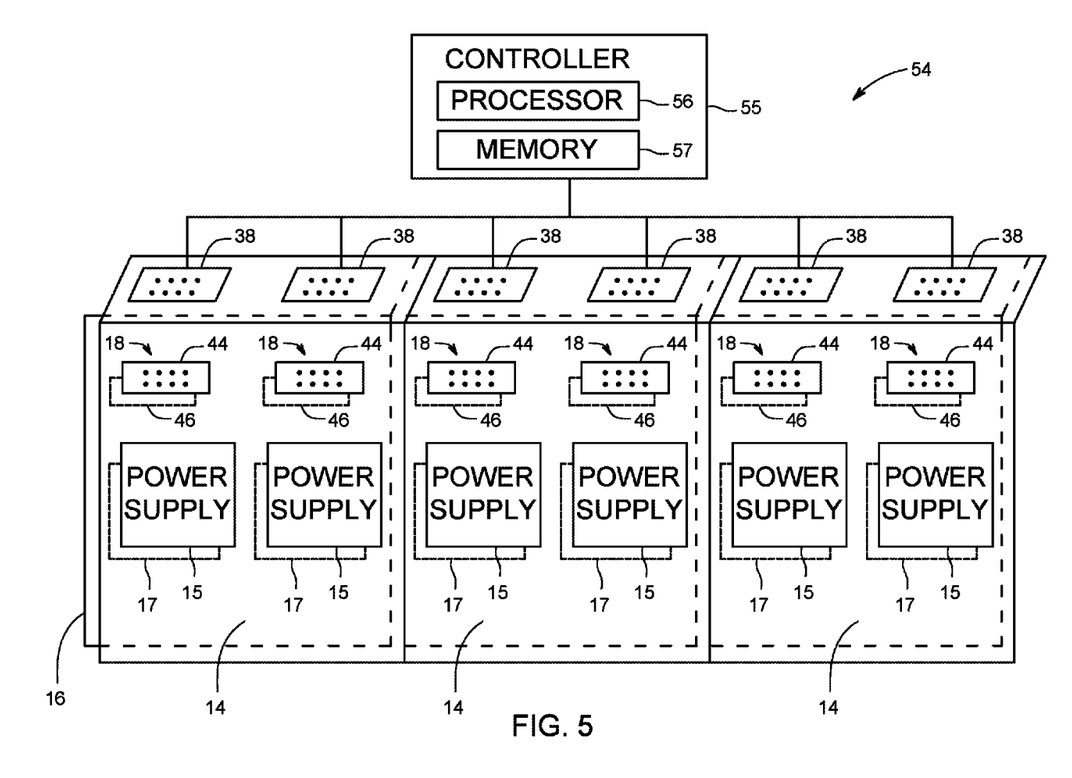
FIG. 5 is a schematic diagram of an arrangement of power supply boards and gate driver boards, in accordance with an embodiment of the present disclosure.

In some embodiments, software programs or instructions, instead of the interconnect board 20, may be used to send control signals to control the power supply boards 14, and more specifically, the power supplied and the frequency of the power supplied by the power supply boards 14. For example, FIG. 5 is a schematic diagram of an arrangement 54 of power supply boards 14 and gate driver boards 16, in accordance with an embodiment of the present disclosure. A controller 55 may be communicatively coupled to each gate driver board 16 (for example, via the one or more inputs 38 of the gate driver board 16). The controller may include one or more processors 56 and a memory 57. The processor(s) 56 and/or other data processing circuitry may be operably coupled with the memory 57 to execute instructions. Such programs or instructions executed by the processor(s) 56 may be stored in any suitable article of manufacture that includes one or more tangible, non-transitory, machine-readable media at least collectively storing the instructions or routines, such as the memory 57. The memory 57 may include any suitable articles of manufacture for storing data and executable machine-readable instructions, such as RAM, ROM, rewritable flash memory, hard drives, and optical discs. Also, programs (e.g., an operating system) encoded on such a computer program product may also include instructions that may be executed by the processor(s) 56. In some embodiments, the controller 55 may only be communicatively coupled to each gate driver board.

In some embodiments, the controller 55 sends control signals to control each power supply board 14 (via the one or more inputs 38 and the one or more connectors 18) to supply power only to the gate driver board 16 that the power supply board 14 is coupled to. In some embodiments, the controller 55 sends control signals to control each power supply board 14 to combine, augment, and/or apportion the power supplied and/or the frequency at with the power is supplied from all the power supply boards 14 communicatively coupled to the controller 55. The controller 55 may, for example, send control signals to direct a portion of the total power supplied by all the power supply boards 14 that are connected to the gate driver boards 16 that are communicatively coupled to the controller 55, at a desired frequency, to one or more target gate driver boards 16 that are communicatively coupled to the controller 55. In some embodiments, the controller 55 may instead be one or more controllers located on the power supply boards 14.

Figure 6:
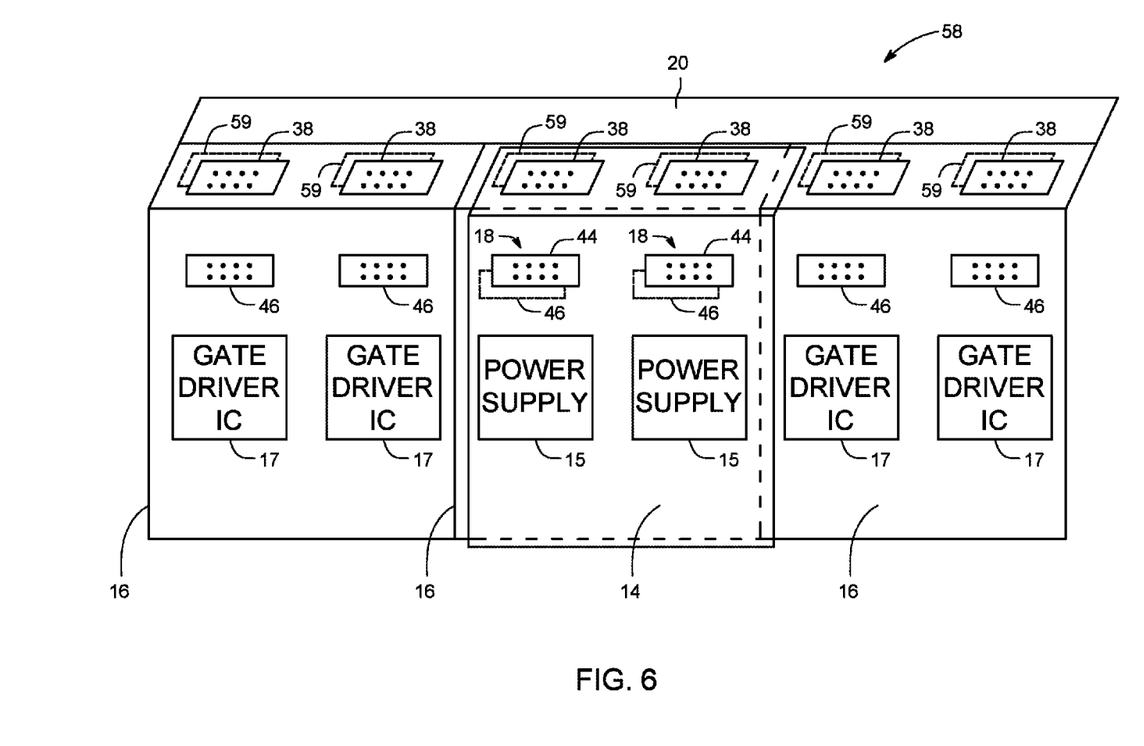
FIG. 6 is a schematic diagram of an arrangement of a power supply board, gate driver boards, and an interconnect board, in accordance with an embodiment of the present disclosure.

Because the interconnect board 20 may couple the one or more signal paths of a first gate driver board 16 with the one or more signal paths of a second gate driver board 16, the connectors 18 may enable the one or more power supplies 15 of the power supply board 14 to provide input power to not only the first gate driver board 16, but also the second gate driver board 16. As shown in a schematic diagram of an arrangement 58 depicted FIG. 6, a single power supply board 14 with two power supplies 15 is coupled to a gate driver board 16 that is coupled to the interconnect board 20. The interconnect board 20 is also coupled to two other gate driver boards 16. The two power supplies 15 of the single power supply board 14 may power all three of the gate driver boards 16 coupled to the interconnect board 20. Advantageously, when a power supply board 14 fails, replacement of an expensive and complex circuit board that includes power supply components and gate driver components may be avoided. Instead, the power supply board 14 may simply be unplugged and replaced. In some embodiments, a surplus of power supply boards 14 may be coupled to the gate driver boards 16 coupled to the interconnect board 20, such that when the one or more power supplies 15 of a power supply board 14 fails, one or more of the other power supplies 15 of the other power supply boards 14 that remain coupled to the interconnect board 20 may provide power to the one or more gate driver boards 16 coupled to the interconnect board 20.

Figure 7:
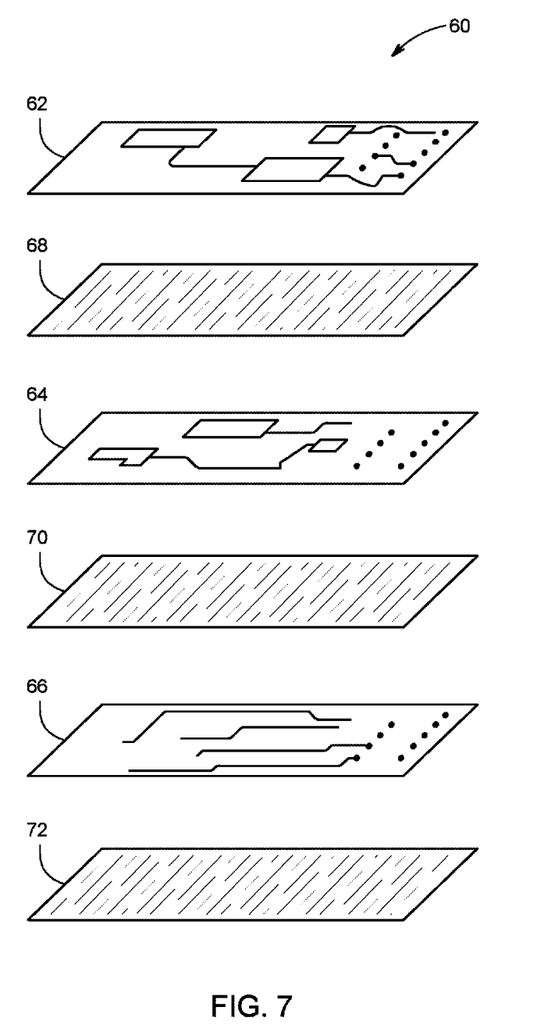
FIG. 7 is an exploded view of a circuit board, in accordance with an embodiment of the present disclosure.

Turning now to FIG. 7, an exploded view of a circuit board 60, in accordance with an embodiment of the present disclosure is illustrated. The circuit board 60 may illustrate an embodiment of the power supply board 14, the gate driver board 16, or the interconnect board 20, for instance. The circuit board 60 may include multiple layers, including one or more tracing layers 62, 64, 66. The tracing layer (e.g., 62) includes conductive traces (i.e., paths) designed for an electrical signal to travel. The conductive traces may be designed based on a use of the circuit board 60 (e.g., use as the power supply board 14, the gate driver board 16, or the interconnect board 20). Under each tracing layer 62, 64, 66 may be a copper layer 68, 70, 72. When an electrical signal (e.g., in the tracing layer 62) is traveling near the copper layer (e.g., 68), eddy currents may be generated in the copper layer 68. The eddy currents may create a magnetic field that prevents EMI noise generated from the nearby electrical signal from penetrating the copper layer 68. As a result, the copper layer 68 may shield EMI noise, control impedance, and provide faster signal travel and performance. In the same manner, the copper layers 68, 70, 72 may shield the tracing layers 62, 64, 66 from EMI noise generated from other sources, such as the SiC MOSFET 12, other power supply boards 14, gate driver boards 16, interconnect boards 20, etc.

Figure 8:
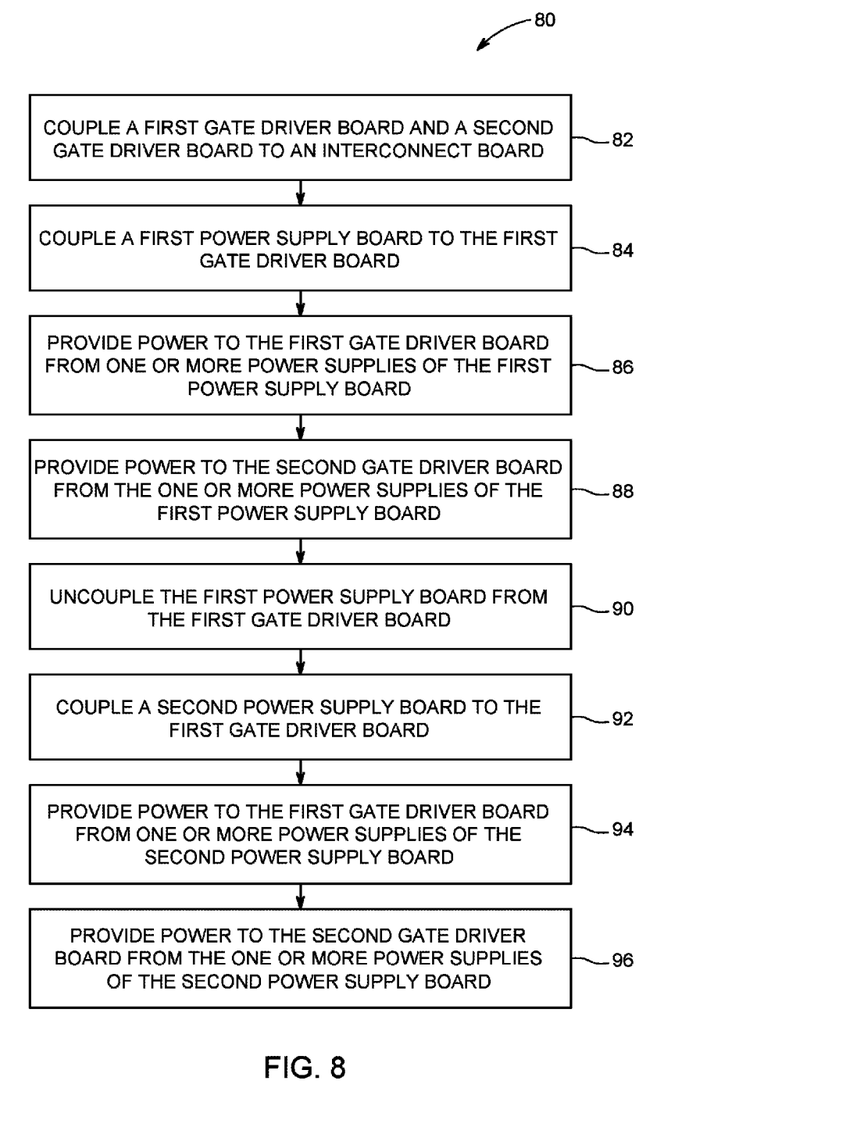
FIG. 8. is a flowchart of a method for reducing electromagnetic interference noise using modular circuit boards for powering and driving a silicon carbide semiconductor power device, in accordance with an embodiment of the present disclosure

Turning now to FIG. 8, a flowchart of a method 80 for reducing EMI noise using modular circuit boards for powering and driving a silicon carbide semiconductor power device, in accordance with an embodiment of the present disclosure, is illustrated. A first gate driver board 16 and a second gate driver board 16 are each coupled (block 82) to an interconnect board 20. The first gate driver board 16 and the second gate driver board 16 may each include one or more gate driver integrated circuits 17 that provide current to drive a gate of the silicon carbide semiconductor power device (e.g., the SiC MOSFET 12). The gate driver integrated circuit 17 may amplify a low-power input in order to output a high current to drive a gate capacitance of a SiC MOSFET 12. The interconnect board 20 may be configured to couple one or more signal paths of the first gate driver board 16 to one or more signal paths of the second gate driver board 16 via one or more circuit traces. The interconnect board 20 may enable plugging and unplugging the gate driver boards 16 into and out of the interconnect board 20 for ease of replacement.

A first power supply board 14 is coupled (block 84) to the first gate driver board 16. The first power supply board 14 may generate, convert, or transfer power from one or more power supplies 15 to the first gate driver board 16. The first gate driver board 16 may then transfer the power from the first power supply board 14 to the one or more SiC MOSFETs 12. The first power supply board 14 may be coupled to the first gate driver board 16 via a first set of connectors 18. The first set of connectors 18 may couple the one or more signal paths of the first gate driver board 16 to one or more signal paths of the first power supply board 14. Each connector 18 of the first set of connectors may include a first portion (e.g., a male connection 44) that may be located on the first power supply board 14 and a second portion (e.g., a female connection 46) that may be located on the first gate driver board 16 (or vice versa). The first portion 44 and the second portion 46 of the connector 18 may be configured to enable plugging and unplugging the first portion 44 into and from the second portion 46 of the connector 18 for ease of replacement. The first set of connectors 18 may enable the one or more power supplies 15 of the first power supply board 14 to provide input power to the one or more gate driver integrated circuits 17 of the first gate driver board 16. In some embodiments, the first power supply board 14 includes one or more isolation transformers 36. For example, the first power supply board 14 may use the one or more isolation transformers 36 to provide galvanic isolation and protect the first gate driver board 16, the second gate driver board 16, and/or the one or more SiC MOSFETs 12. The isolation transformer 36 may further suppress EMI noise generated from the one or more SiC MOSFETs 12 propagated to the one or more power supplies 15 or the rest of the system 30.

The one or more power supplies 15 of the first power supply board 14 provide (block 86) power to the first gate driver board 16 via the first set of connectors 18. In particular, the first set of connectors 18 enable the one or more power supplies 15 of the first power supply board 14 to provide power through the one or more signal paths of the first power supply board 14 to the one or more signal paths of the first gate driver board 16 by coupling the one or more signal paths of the first power supply board 14 to the one or more signal paths of the first gate driver board 16. The one or more power supplies 15 of the first power supply 14 also provide (block 88) power to the second gate driver board 16 via the first set of connectors 18 and the interconnect board 20. In particular, the interconnect board 20 enables the first gate driver board 16 to provide power (supplied from the one or more power supplies 15 of the first power supply board 14 via the first set of connectors 18) through the one or more signal paths of the first gate driver board 16 to the one or more signal paths of the second gate driver board 16 by coupling the one or more signal paths of the first gate driver board 16 to the one or more signal paths of the second gate driver board 16. It should be noted that the interconnect board 20 may couple to any number of gate driver boards 16, and the one or more power supplies 15 of the power supply board 14 may provide power to any number of the gate driver boards 16 coupled to the interconnect board 20.

It may be desired to replace the first power supply board 14 in certain instances (e.g., due to failure). Advantageously, the connector 18 may be configured to enable unplugging the male connection 44 of the first power supply board 14 from the female connection 46 of the first gate driver board 16 for ease of replacement. Thus, if a replacement is desired, the first power supply board 14 is uncoupled (block 90) from the first gate driver board 16. A second power supply board 14 is then coupled (block 92) to the first gate driver board 16. The second power supply board 14 may generate, convert, or transfer power from one or more power supplies 15 to the first gate driver board 16. The first gate driver board 16 may then transfer the power from the second power supply board 14 to the one or more SiC MOSFETs 12. The second power supply board 14 may be coupled to the first gate driver board 16 via a second set of connectors 18. The second set of connectors 18 may couple the one or more signal paths of the first gate driver board 16 to one or more signal paths of the second power supply board 14. Each connector 18 of the second set of connectors may include a third portion (e.g., a male connection 44) that may be located on the second power supply board 14 and the second portion 46 that may be located on the first gate driver board 16. The third portion 44 and the second portion 46 of the second set of connectors 18 may be configured to enable plugging and unplugging the third portion 44 of the second power supply board 14 into and from the second portion 46 of the first gate driver board 16 for ease of replacement. The second set of connectors 18 may enable the one or more power supplies 15 of the second power supply board 14 to provide input power to the first gate driver board 16.

The one or more power supplies 15 of the second power supply board 14 provide (block 94) power to the first gate driver board 16 via the second set of connectors 18. In particular, the second set of connectors 18 enable the one or more power supplies 15 of the second power supply board 14 to provide power through the one or more signal paths of the second power supply board 14 to the one or more signal paths of the first gate driver board 16 by coupling the one or more signal paths of the second power supply board 14 to the one or more signal paths of the first gate driver board 16. The one or more power supplies 15 of the second power supply 14 also provide (block 96) power to the second gate driver board 16 via the second set of connectors 18 and the interconnect board 20. In particular, the interconnect board 20 enables the first gate driver board 16 to provide power (supplied from the one or more power supplies 15 of the second power supply board 14 via the second set of connectors 18) through the one or more signal paths of the first gate driver board 16 to the one or more signal paths of the second gate driver board 16 by coupling the one or more signal paths of the first gate driver board 16 to the one or more signal paths of the second gate driver board 16.

In some embodiments, a third power supply board 14 may be coupled to the second gate driver board 16. The third power supply board 14 may generate, convert, or transfer power from one or more power supplies 15 to the second gate driver board 16. The second gate driver board 16 may then transfer the power from the third power supply board 14 to the one or more SiC MOSFETs 12. The third power supply board 14 may be coupled to the second gate driver board 16 via a third set of connectors 18 that includes a fourth portion (e.g., a male connection 44) that may be located on the third power supply board 14 and a fifth portion (e.g., a female connection 46) that may be located on the second gate driver board 16. The fourth portion 44 and the fifth portion 46 of each connector 18 of the third set of connectors may be configured to enable plugging and unplugging the fourth portion 44 of the second power supply board 14 into and from the fifth portion 46 of the first gate driver board 16 for ease of replacement. The connector 18 may enable the third power supply board 14 to provide input power to the second gate driver board 16. Accordingly, the one or more power supplies 15 of the third power supply board 14 may provide power to the second gate driver board 16 via the third set of connectors 18.

In some embodiments, the one or more power supplies 15 of the third power supply board 14 may provide power to the second gate driver board 16 via the third set of connectors 18 while the one or more power supplies 15 of the first power supply board 14 provides power to the first gate driver board 16 in block 86. In some embodiments, the one or more power supplies 15 of the third power supply board 14 may provide power to the second gate driver board 16 via the third set of connectors 18 when the first power supply board 14 is uncoupled from the first gate driver board 16. Additionally, when the first power supply board 14 is uncoupled from the first gate driver board 16, the third power supply board 14 may provide power to the first gate driver board 16 via the third set of connectors 18 and the interconnect board 20. In particular, the interconnect board 20 enables the second gate driver board 16 to provide power (supplied from the one or more power supplies 15 of the third power supply board 14 via the third set of connectors 18) through the one or more signal paths of the second gate driver board 16 to the one or more signal paths of the first gate driver board 16 by coupling the one or more signal paths of the second gate driver board 16 to the one or more signal paths of the first gate driver board 16.

In some embodiments, when the second power supply board 14 is coupled to the first gate driver board 16, the one or more power supplies 15 of the third power supply board 14 may continue to provide power to the second gate driver board 16 via the third set of connectors 18 and to the first gate driver board 16 via the third set of connectors 18 and the interconnect board 20. In additional or alternative embodiments, the one or more power supplies 15 of the second power supply board 14 provide power to the first gate driver board 16 (as shown in block 94) via the second set of connectors 18 and the second gate driver board 16 (as shown in block 96) via the second set of connectors 18 and the interconnect board 20. It should be noted that the interconnect board 20 may couple to any number of gate driver boards 16, and that each gate driver board may be coupled to a power supply board 14. The interconnect board 20 may be configured to combine, augment, and/or apportion the power supplied and the frequency at which the power is supplied by the one or more power supplies 15 of each power supply board 14 coupled to the interconnect board 20. For example, the interconnect board 20 may be configured to direct a portion of the total power supplied by all the power supply boards 14 coupled to the gate driver boards 16 that are coupled to the interconnect board 20, at a desired frequency, to one or more target gate driver boards 16 that are coupled to the interconnect board 20.

Technical effects of the invention include systems and methods for a modular layout for use with an SiC semiconductor power device. In particular, the modular layout includes gate driver circuit boards, power supply circuit boards, and interconnect circuit boards, wherein each circuit board may be easily replaced due to the modular layout. The gate driver circuit boards may amplify a low-power input in order to output a high current to drive a gate capacitance of the SiC semiconductor power device. The power supply circuit boards may generate, convert, or transfer power from a power source to the gate driver circuit boards. The interconnect circuit boards may provide connections and separation between a plurality of gate driver boards. In this manner, the modular layout is designed to provide separation between the gate driver circuit boards and the power supply boards to reduce EMI noise. The present disclosure includes embodiments that use symmetrical circuitry to reduce common mode noise by using specific circuit tracing patterns and circuit components. The present disclosure further includes embodiments that reduce EMI noise by using specifically-designed circuit boards (e.g., including a copper layer under a tracing layer).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A system, comprising:
one or more silicon carbide semiconductor power devices;
a power supply circuit board, configured to provide power to a first gate driver circuit board via one or more connectors, wherein the power supply circuit board comprises one or more power supplies;
the first gate driver circuit board, coupled to the one or more silicon carbide semiconductor power devices and configured to provide current to drive one or more gates of the one or more silicon carbide semiconductor power devices, wherein one or more signal paths of the first gate driver circuit board are coupled to one or more signal paths of the power supply circuit board via the one or more connectors, wherein the first gate driver circuit board is separated from the power supply circuit board, wherein the first gate driver circuit board comprises one or more gate driver integrated circuits; and
an interconnect circuit board, coupled to the first gate driver circuit board, wherein the interconnect circuit board is configured to couple the one or more signal paths of the first gate driver circuit board to one or more signal paths of a second gate driver circuit board, wherein the second gate driver circuit board comprises one or more gate driver integrated circuits.

2. The system of claim 1, wherein the power supply circuit board is configured to provide power to the second gate driver circuit board via the interconnect circuit board.

3. The system of claim 1, wherein the interconnect circuit board is configured to enable the first gate driver circuit board and the second gate driver circuit board to plug into the interconnect circuit board and unplug from the interconnect circuit board.

4. The system of claim 1, wherein the first gate driver board and or the second gate driver board comprises desaturation circuitry.

5. The system of claim 1, wherein each gate driver integrated circuit of the first gate driver circuit board and the second gate driver circuit board is coupled to one silicon carbide semiconductor power device of the one or more silicon carbide semiconductor power devices.

6. The system of claim 1, wherein the interconnect circuit board is configured to modify an input signal to match a propagation delay of logic gates in the power supply circuit board, the first gate driver circuit board, the second gate driver circuit board, or the interconnect circuit board.

7. The system of claim 1, wherein a supply voltage of the first gate driver circuit board or the second gate driver circuit board may be adjusted to match a propagation delay of logic gates in the power supply circuit board, the first gate driver circuit board, the second gate driver circuit board, or the interconnect circuit board.

8. A system, comprising:
one or more silicon carbide metal-oxide-semiconductor field-effect transistors;
a first power supply circuit board configured to provide power to a first gate driver circuit board, wherein the first power supply circuit board comprises a tracing layer disposed on a copper layer;
the first gate driver circuit board, coupled to the one or more silicon carbide metal-oxide-semiconductor field-effect transistors, wherein the first gate driver circuit board is configured to provide current to drive one or more gates of the one or more silicon carbide metal-oxide-semiconductor field-effect transistors, wherein one or more signal paths of the first gate driver circuit board are coupled to one or more signal paths of the first power supply circuit board, wherein the first gate driver circuit board is separated from the first power supply circuit board, and wherein the first gate driver circuit board comprises a tracing layer disposed on a copper layer; and
an interconnect circuit board, coupled to the first gate driver circuit board, wherein the interconnect circuit board is configured to couple the one or more signal paths of the first gate driver circuit board to one or more signal paths of a second gate driver circuit board, wherein the interconnect circuit board comprises a tracing layer disposed on a copper layer, and wherein the second gate driver circuit board comprises a tracing layer disposed on a copper layer.

9. The system of claim 8, wherein the one or more signal paths of the second gate driver circuit board are coupled to one or more signal paths of a second power supply circuit board, wherein the second power supply circuit board is configured to provide power to the second gate driver circuit board.

10. The system of claim 9, wherein the interconnect circuit board is configured to combine a first power supplied by one or more power supplies of the first power supply circuit board and a second power supplied by one or more power supplies of the second power supply circuit board.

11. The system of claim 10, wherein:
the one or more power supplies of the first power supply circuit board comprise a first switching frequency;
the one or more power supplies of the second power supply circuit board comprise a second switching frequency;
and combining the first power supplied by the one or more power supplies of the first power supply circuit board and the second power supplied by the one or more power supplies of the second power supply circuit board enables a third switching frequency that is greater than the first switching frequency and greater than the second switching frequency.

12. The system of claim 8, wherein the first power supply circuit board comprises one or more isolation transformer configured to provide galvanic isolation.

13. The system of claim 12, wherein the one or more gate driver integrated circuits are configured to amplify the low-power input signal provided by one or more power supplies of the first power supply circuit board.

14. The system of claim 8, wherein the first gate driver circuit board comprises one or more gate driver integrated circuits, and wherein the one or more gate driver integrated circuits are configured to amplify a low-power input signal provided by the first power supply circuit board.

15. A method, comprising:
coupling a first gate driver circuit board and a second gate driver circuit board to an interconnect circuit board, wherein the first gate driver circuit board and the second gate driver circuit board are configured to provide current to drive one or more gates of one or more silicon carbide semiconductor power devices and wherein the interconnect circuit board is configured to couple one or more signal paths of the first gate driver circuit board to one or more signal paths of a second gate driver circuit board;
coupling a first power supply circuit board to the first gate driver circuit board via a first set of connectors, wherein each connector of the first set of connectors comprises a first portion disposed on the first power supply circuit board and a second portion disposed on the first gate driver circuit board;
providing power to the first gate driver circuit board from one or more power supplies of the first power supply circuit board via the first set of connectors;
providing power to the second gate driver circuit board from the one or more power supplies of the first power supply circuit board via the first set of connectors and the interconnect circuit board;
uncoupling the first power supply circuit board from the first gate driver circuit board;
coupling a second power supply circuit board to the first gate driver circuit board via a second set of connectors, wherein each connector of the second set of connectors comprises a third portion disposed on the second power supply circuit board and the second portion disposed on the first gate driver circuit board;
providing power to the first gate driver circuit board from the one or more power supplies of the second power supply circuit board via the second set of connectors; and
providing power to the second gate driver circuit board from the one or more power supplies of the second power supply circuit board via the second set of connectors and the interconnect circuit board.

16. The method of claim 15, comprising:
coupling a third power supply circuit board to the second gate driver circuit board via a third set of connectors, wherein each connector of the third set of connectors comprises a fourth portion disposed on the third power supply circuit board and a fifth portion disposed on the second gate driver circuit board; and
providing power to the second gate driver circuit board from the one or more power supplies of the third power supply circuit board via the third set of connectors.

17. The method of claim 16, comprising:
providing power to the first gate driver circuit board from the one or more power supplies of the third power supply circuit board via the third set of connectors and the interconnect circuit board when the first power supply circuit board is uncoupled from the first gate driver circuit board.

18. The method of claim 15, wherein the first gate driver circuit board, the second gate driver circuit board, the first power supply circuit board, the second power supply circuit board, or the interconnect circuit board comprises a first tracing layer disposed on a first copper layer, the first copper layer disposed on a second tracing layer, and the second tracing layer disposed on a second copper layer.

19. A system, comprising:
a first set of silicon carbide semiconductor power devices;
a second set of silicon carbide semiconductor power devices;
a first power supply circuit board, configured to provide power to a first gate driver circuit board, wherein the first power supply circuit board comprises one or more power supplies;
a second power supply circuit board, configured to provide power to a second gate driver circuit board, wherein the second power supply circuit board comprises one or more power supplies;
the first gate driver circuit board, coupled to the first set of silicon carbide semiconductor power devices and configured to provide current to drive one or more gates of the first set of silicon carbide semiconductor power devices, wherein one or more signal paths of the first gate driver circuit board are coupled to one or more signal paths of the first power supply circuit board, wherein the first gate driver circuit board is separated from the first power supply circuit board, wherein the first gate driver circuit board comprises one or more gate driver integrated circuits;
the second gate driver circuit board, coupled to the second set of silicon carbide semiconductor power devices and configured to provide current to drive one or more gates of the second set of silicon carbide semiconductor power devices, wherein one or more signal paths of the second gate driver circuit board are coupled to one or more signal paths of the second power supply circuit board, wherein the second gate driver circuit board is separated from the second power supply circuit board, wherein the second gate driver circuit board comprises one or more gate driver integrated circuits; and
a controller, comprising one or more processors, wherein the controller is coupled to the first power supply circuit board and the second power supply circuit board, wherein the one or more processors are configured to control a total power provided by the first power supply circuit board and the second power supply circuit board.

20. The system of claim 19, wherein the one or more processors are configured to control a frequency at which the total power is provided by the first power supply circuit board and the second power supply circuit board.

21. The system of claim 19, wherein the one or more processors are configured to provide a portion of the total power provided by the first power supply circuit board and the second power supply circuit board to the first gate driver circuit board.

22. The system of claim 19, wherein the one or more processors are configured to provide a portion of the total power provided by the first power supply circuit board and the second power supply circuit board to the second gate driver circuit board.

* * * * *